United States Patent
Zhang et al.

(10) Patent No.: US 8,285,526 B2
(45) Date of Patent: Oct. 9, 2012

(54) FINITE DIFFERENCE ALGORITHM FOR SOLVING SLENDER DROPLET EVAPORATION WITH MOVING CONTACT LINES

(75) Inventors: Jie Zhang, Santa Clara, CA (US); Jiun-Der Yu, Sunnyvale, CA (US)

(73) Assignee: Seiko Epson Corporation, Tokyo (JP)

( * ) Notice: Subject to any disclaimer, the term of this patent is extended or adjusted under 35 U.S.C. 154(b) by 256 days.

(21) Appl. No.: 12/629,273

(22) Filed: Dec. 2, 2009

(65) Prior Publication Data

US 2011/0131018 A1   Jun. 2, 2011

(51) Int. Cl.
G06F 7/60 (2006.01)
G06F 17/10 (2006.01)

(52) U.S. Cl. ................................. 703/2; 703/9
(58) Field of Classification Search ............ 703/2, 9
See application file for complete search history.

(56) References Cited

U.S. PATENT DOCUMENTS

| | | | |
|---|---|---|---|
| 6,391,986 B1 | 5/2002 | Goode et al. |
| 6,471,761 B2 | 10/2002 | Fan et al. |
| 6,660,209 B2 | 12/2003 | Leyden et al. |
| 6,754,551 B1 | 6/2004 | Zohar et al. |
| 6,913,832 B2 | 7/2005 | Fan et al. |
| 7,022,534 B2 | 4/2006 | Gupta et al. |
| 7,085,695 B2 | 8/2006 | Yu et al. |
| 7,117,138 B2 | 10/2006 | Yu et al. |
| 7,147,306 B2 | 12/2006 | Silverbrook et al. |
| 7,160,633 B2 | 1/2007 | Tai et al. |
| 7,169,989 B2 | 1/2007 | Marks et al. |
| 7,176,040 B2 | 2/2007 | Sirringhaus et al. |
| 2005/0052120 A1 | 3/2005 | Gupta et al. |
| 2007/0043544 A1 | 2/2007 | Song et al. |
| 2007/0136042 A1 | 6/2007 | Yu |
| 2007/0239414 A1 | 10/2007 | Song et al. |
| 2007/0250296 A1 | 10/2007 | Shima et al. |

FOREIGN PATENT DOCUMENTS

| | | |
|---|---|---|
| EP | 0 765 236 B1 | 7/1999 |
| EP | 1 208 985 A2 | 5/2002 |
| JP | 10-256330 | 9/1998 |

OTHER PUBLICATIONS

Fischer "Particle Convection in an Evaporating Colloidal Droplet" Department of Chemical Engineering Princeton, 2002.*
Anderson et al. "The Spreading of Volatile Liquid Droplets on Heated Surfaces" Department of Engineering Sciences and Applied Mathematics Northwestern University 1994.*

(Continued)

*Primary Examiner* — Saif Alhija

(57) ABSTRACT

A system and method for simulating a droplet on a substrate with a moving contact line. The height of the droplet above the substrate is represented as a height function. A height evolution equation represents how the height of a droplet with moving contact line varies over time. The height function at a first point in space and a first point in time is calculated. An extrapolated height value at the first point in time is based on the height function at the first point in space and the first point in time, and the contact line at the first point in time. The extrapolated height value is at a second point in space below the substrate. The height evolution equation is used to calculate the height function at a second point in time based upon the extrapolated height value at the first point in time.

16 Claims, 4 Drawing Sheets

OTHER PUBLICATIONS

Anderson et al. "A Model for a Spreading and Melting Droplet on a Heated Substrate" Society for Industrial and Applied Mathematics 2001.*

Liou, M., "A Generalized Procedure for Constructing an Upwind-Based VD Scheme", 25th Aerospace Sciences Meeting, Jan. 12-15, 1987.

Harten, Ami et al., "Uniformly High Order Accurate Essentially Non-Oscillatory Schemes III", Institute for Computer Applications in Science and Engineering NASA, Apr. 1986.

Chen, et al., Evaporation evolution of volatile Liquid droplets in nanoliter wells, Sensors and Actuators A 130-131, (2006), 12-19.

Guena, G.,et al., "Evaporation of sessile liquid droplets", Colloids and Surfaces A: Physicochem Eng. Aspects 291, 2006, pp. 191-196.

Hu, H., et al., "Evaporation of a Sessile Droplet on a Substrate", J. Phys. Chem. B, 2002, 106, pp. 1334-1344.

Schunk, P.R., et al., "Finite element modeling of evaporation and condensation during sol-gel film and fiber formation", VIII International Conference on Finite Elements in Fluids, Barcelona, Spain Sep. 20-24, 1993.

de Gans, Berend-Jan, et al., "Inkjet Printing of Polymers: State of the Art and Future Developments", Advanced Materials, 2004, 16, No. 3, Feb. 3.

Chernyak, V. "The Kinetic Theory of Droplet Evaporation". J. Aerosol Sci. vol. 26, No. 6, pp. 873-885, 1995.

Widjaja, E., et al., "Numerical study of vapor phase-diffusion driven sessile drop evaporation", Elsevier, Computers & Chemical Engineering 32, 2008, pp. 2169-2178.

Bayada, G., et al., "On a free boundary problem for the Reynolds equation derived from the Stokes system with Tresca boundary conditions", Journal of Mathematical Analysis and Applications, J. Math. Anal. Appl. 282, 2003, pp. 212-231.

Deegan, R., "Pattern formation in drying drops", Physical Review E, vol. 61, No. 1, Jan. 2000, pp. 475-485.

Percin G., et al., "Piezoelectric droplet ejector for ink-jet printing of fluids and solid particles", Review of Scientific Instruments, vol. 74, No. 2, Feb. 2003, pp. 1120-1127.

Tarasevich, Y., "Simple analytical model of capillary flow in an evaporating sessile drop", Physical Review E 71, 027201, 2005.

Decent, S.P., "The spreading of a viscous microdrop on a solid surface", Microfluid Nanofluid 2006, 2: 537-549.

Schwartz, L.W., Theoretical and Numerical Modeling of Coating Flow on Simple and Complex Substrates including Rheology, Drying and Marangoni Effects, Advances in Coating and Drying of Thin Films, 1999.

Chen, C., et al., "Uniform Solute Deposition of Evaporable Droplet in nanoliter Wells", Journal of Microelectromechanical Systems, vol. 16, No. 5, Oct. 2007, pp. 1209-1218.

Fischer, B., "Particle Convection in an Evaporating Colloidal Droplet", Langmuir 2002, 18, pp. 60-67.

Bhandarkar, M., et al., "Charm ++ Finite Element Method (FEM) Framework Manual", Oct. 8, 2008, ver. 1.2, Parallel Programming Laboratory, University of Illinois at Urbana-Champaign.

Schwartz, A., et al., "Studies of Dynamic Contact Angles on Solids", National Aeronautics and Space Administration, NASA, contract NA53-11522, Jul. 7, 1970.

Tseng, F.G., et al., "A High-Resolution High-Frequency Monolithic Top-Shooting Microinjector Free of Satellite Drops-Part I: Concept, Design, and Model", Journal of Microelectromechanical Systems, vol. 11, No. 5, Oct. 2002, pp. 427-436.

Pasandideh-Fard, M., et al., "A three-dimensional model of droplet impact and solidification", International Journal of Heat and Mass Transfer 45, 2002, pp. 2229-2242.

Hu, H., et al., "Analysis of the Microfluid Flow in an Evaporating Sessile Droplet", Langmuir 2005, 21, pp. 3963-3971.

Hu, H., et al., "Analysis of the Effects of Marangoni Stresses on the Microflow in an Evaporating Sessile Droplet", Langmuir 2005, 21, pp. 3972-3980.

Deegan, R., et al., "Capillary flow as the cause of ring stains from dried liquid drops", Nature, vol. 389, Oct. 1997, pp. 827-829.

Deegan, R., et al., "Capillary flow as the cause of ring stains from dried liquid drops", James Franck Institute, Chicago, IL, Jul. 15, 1997, pp. 1-4.

Popov, Y.O., et al., "Characteristic Angles in the Wetting of an Angular Region: Deposit Growth", Department of Physics, University of Chicago, Jun. 6, 2003, pp. 1-36.

Deegan, R., et al., "Contact line deposits in an evaporating drop", Physical Review E., vol. 62, No. 1, Jul. 2000, pp. 756-765.

Sultan, E., et al., "Diffusion-limited evaporation of thin polar liquid films", Journal of Engineering Mathematics 50: 2004, pp. 209-222.

Widjaja, E., et al., "Dynamics of sessile droplet evaporation: A comparison of the spine and the elliptic mesh generation methods", Elsevier, Computers & Chemical Engineering 31, 2007, pp. 219-232.

Dussan, E., et al., "On the motion of a fluid-fluid interface along a solid surface", J. Fluid Mech., 1974, vol. 65, part 1, pp. 71-95.

Greenspan, H.P., "On the motion of a small viscous droplet that wets a surface", J. Fluid Mech. 1979, vol. 84, part 1, pp. 125-143.

Lopez, P.G., et al., "Stability and evolution of a dry spot", Physics of Fluids, vol. 13, No. 6, Jun. 2001 American Institute of Physics.

Oron, A., et al., "Long-Scale evolution of thin liquid films", Department of Mechanical Engineering, Reviews of Modern Physics, vol. 69, No. 3, Jul. 1997, The American Physical Society.

Yu, Y., et al., "Capillary flow in an evaporating sessile drop", Aug. 2004.

von Bahr, M., "Wetting and Capillary Flow of Surfactant Solutions and Inks", Lund University, 2003.

Bonn, D., et al., "Wetting and spreading", Review of Modern Physics, vol. 81, Apr.-Jun. 2009.

Miranda, L.C.M., et al., "Evaporation and Contraction of a droplet that wets a surface monitored by photoacoustic detection", Physical Review B, vol. 47, No. 7, Feb. 15, 1993.

Cazabat, A.M., "How does a droplet spread?", Contemp. Phys. 1987, vol. 28, No. 4, 347-364.

Moriarty, J.A., et al., "Dynamic Considerations in the Closing and Opening of Holes in Thin Liquid Films", Journal of Colloid and Interface Science 161, 335-342, 1993.

Blake, T.D., et al., "Kinetics of liquid/liquid displacement", Journal of Colloid and Interface Science, vol. 30, issue 3, Jul. 1969, pp. 421-423.

Schwartz, A., et al., "Studies of Dynamic Contact Angles on Solids", Journal of Colloid and Interface Science, vol. 38, No. 2, Feb. 1972, pp. 359-375.

* cited by examiner

500

Identify an index k located at a cell center that is closest to the contact line but still inside the droplet.
502

Estimate the contact angle.
504

Estimate the velocity of the contact line
506

Move the contact line
508

Identify an index *k* located at a cell center that is closest to the contact line but still inside the droplet.
602

Determine the height of the droplet at node with index *k*
604

Assign a height to one or more nodes that are near the contact line but outside the droplet
606

Calculate a differential inside the droplet based on the height assigned to one or more nodes outside the droplet
608

FIG. 6

FINITE DIFFERENCE ALGORITHM FOR SOLVING SLENDER DROPLET EVAPORATION WITH MOVING CONTACT LINES

CROSS-REFERENCE TO RELATED APPLICATIONS

The present application is related to U.S. patent application Ser. No. 12/476,588 filed on Jun. 2, 2009 entitled "A Finite Difference Algorithm for Solving Lubrication Equations with Solute Diffusion" and is hereby incorporated by reference in its entirety. The present application is also related to U.S. patent application Ser. No. 12/411,810 filed on Mar. 26, 2009 entitled "A Finite Element Algorithm for Solving a Fourth Order Nonlinear Lubrication Equation for Droplet Evaporation", and is hereby incorporated by reference in its entirety. The present application is also related to U.S. patent application Ser. No. 12/579,645 filed on Sep. 30, 2009 entitled "An Upwind Algorithm for Solving Lubrication Equations", and is hereby incorporated by reference in its entirety.

BACKGROUND

1. Field of Invention

The present application is directed towards systems and method for simulating the evaporation of a droplet with a moving contact line.

2. Description of the Related Art

Applying inkjet technology to the industrial printing process can greatly improve its efficiency. Inkjet technology can be used to save energy, material, money, and it can also help improve the environment. Inkjet technology may be used in the manufacture of liquid crystal displays (LCD), thin film transistors (TFT), organic light emitting diodes (OLED), solar cells, micro-circuits, and other planar, layered, or 3-D structures. In the inkjet printing process, small droplets of a solution containing a solute with the desired properties and a solvent to make the solution jettable are deposited onto the target area. After the droplets reach the targeted area, the solvent evaporates and only the solute is left to form a final print pattern. The final pattern of the deposited solute directly determines the quality of the desired product.

In order to improve the quality of the final product, it is desirable to understand how the final pattern is formed in a realistic environment, what are the major factors affecting the final pattern, and how to control the production parameters in order to achieve a final product with the desired quality. In the final stage of ink drying process, the aspect ratio of length to height becomes quite large. Consequently, it is difficult to use traditional direct simulation methods to simulate the entire process. Lubrication equations may be applied to describe such phenomenon; however in the prior art lubrication type equations have been limited to periodic thin films, infinite thin films or films with fixed contact lines. This is because a moving contact used along with lubrication type equations produces a singularity at the contact line.

What has not been developed are systems and methods for modeling and predicating the evaporation of a droplet with a moving contact line. The present invention is directed towards addressing these problems.

SUMMARY OF INVENTION

The present invention is a system or method for simulating a droplet on a substrate with a moving contact line. An embodiment of the present invention is a method that has been encoded upon a computer-readable medium with instructions for a processor to perform. The method may simulate a droplet of a fluid on a substrate. The method may include a plurality of instructions that are executed by the processor. The method includes instructions for representing the height of the droplet above the substrate as a height function. The method also includes using a height evolution equation to represent how the height function varies over time including the effect of a moving contact line. The method includes calculating the height function at a first point in space and a first point in time. The method includes calculating an extrapolated height value at the first point in time based on the height function at the first point in space and the first point in time, and the contact line at the first point in time. The extrapolated height value is at a second point in space is below the substrate. The method includes using the height evolution equation to calculate the height function at a second point in time based upon the extrapolated height value at the first point in time.

In an embodiment of the present invention the method for simulating the droplet may include representing a first interface between the droplet and an environment with a height function. The height function represents a distance between the first interface and the substrate. The first distance is parallel to a first axis of the coordinate system. The contact line represents an intersection of the first interface and the substrate. The height evolution equation represents how the height of the droplet varies over time using a partial derivative of the height function with respect to time. The partial derivate of the height function with respect to time is equated to a first differential function dependent upon the height function and a slip coefficient. The slip coefficient represents a slipping interaction between the substrate, the droplet, and the environment. The slip coefficient also represents the effect that the slipping contact line has on motion of the fluid in the droplet. The height evolution equation is independent of the spatial coordinate of the first axis.

The present invention may include calculating a contact angle at the first point in time. The contact angle is angle between the first interface and the substrate. The present invention may also include calculating a contact line velocity at a first point in time as a function of the difference between: the contact angle at the first point in time raised to the power of a first exponent; and a static contact angle raised to the first exponent. The present invention may include calculating a position of the contact line at the second point in time based on the contact line velocity at the first point in time. The first exponent may be 1 or 3.

In an embodiment of the present invention, a linear extrapolation method may be used to calculate the extrapolated height function at the second point in space and the first point in time based upon a linear relationship. The linear relationship may be between: the height function at the first point in time and space; the contact line at the point in time; and the second point in space.

In an embodiment of the present invention, may include instructions for calculating a second extrapolated height value at the first point in time based on the height function at the first point in space and the first point in time, and the contact line at the first point in time. The second extrapolated height value may be at a third point in space is below the substrate. Using the height evolution equation to calculate the height function at a second point in time may be based upon the extrapolated height value at the first point in time and the second point in space and the second extrapolated height value at a third point in space.

In an embodiment of the present invention a fluid may be prepared in response to the results of a simulation.

An embodiment of the present invention a height evolution equation may include equating a temporal derivative of the height function to a sum of a first function and an evaporation function. The first function may include a spatial derivative of a second function. The second function may include the product of a third function and a spatial derivative of a fourth function. The third function may be the sum of a cube of the height function and a fifth function. The fifth function may include a slip coefficient and the height function.

Other objects and attainments together with a fuller understanding of the invention will become apparent and appreciated by referring to the following description and claims taken in conjunction with the accompanying drawings.

BRIEF DESCRIPTION OF THE DRAWINGS

The present invention can be best understood by reference to the following description taken in conjunction with the accompanying figures, in which like parts may be referred to by like numerals.

FIG. 5 is an illustration of a method that may be used in an embodiment of the present invention.

FIG. 6 is an illustration of an additional method that may be used in an embodiment of the present invention.

DESCRIPTION OF THE PREFERRED EMBODIMENTS

The present invention relates to systems and methods for simulating the evolution of a droplet drying on a substrate. In an embodiment of the present invention the droplet may be produced using inkjet technology. The present invention may be used to simulate the evolution of droplets produced using other techniques without going beyond the spirit and scope of the present invention.

Inkjet technology is conventionally used to print ink on paper. However, a tremendous amount of resources can be saved by applying inkjet technology to other fabrication processes, such as semiconductor fabrication processes, LCD fabrication processes, TFT fabrication processes, OLED fabrication processes, solar cell fabrication processes, etc. In the inkjet printing process, small droplets of a solution containing a solute with the desired properties and a solvent are deposited onto the target area. After the droplets reach the targeted area, the droplet gradually shrinks until a final pattern of the droplet is formed. The final pattern of the droplet directly determines the desired product quality. An individual skilled in the art will appreciate that the present invention may be applied to any droplet on a substrate. The targeted area on which the droplet is deposit may be a flat substrate or a non-flat substrate, without going beyond the scope and spirit of the present invention.

Figure 1:
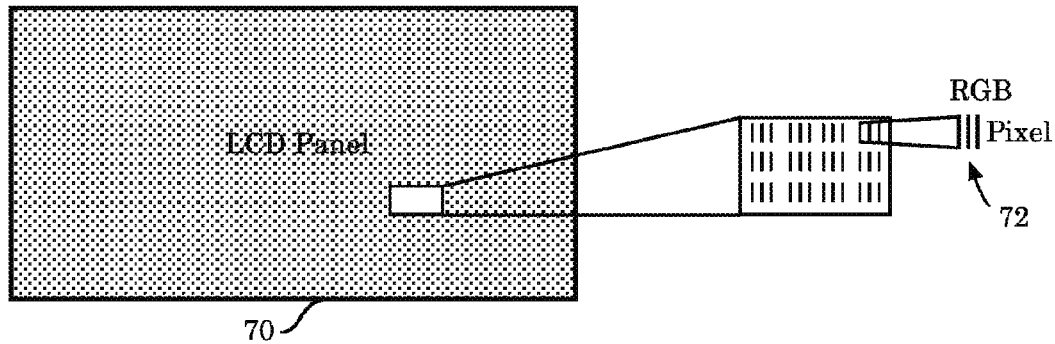
FIG. 1 illustrates an exemplary application of inkjet printing technology.

FIG. 1 is an illustration of an LCD panel 70, which is an exemplary product that can be produced using an industrial printing process such as inkjet printing technology. In an embodiment of the present invention, inkjet printing technology is used to fabricate the LCD panel 70. Traditionally, LCD panels 70 are fabricated using CMOS fabrication technology requiring several processing steps such as masking, deposition, unmasking, etc., to fabricate Red (R), Green (G), and Blue (B) filters 72 on a non-uniform substrate. Each color is made from a different material, and in the traditional fabrication method requires three separate processing steps.

Using inkjet technology, filters made from different materials may all be printed in a single step. Inkjet technology creates images and objects using small droplets of fluid. The inkjet printing head deposits small droplets in a desired pattern on a substrate. Until the droplets dry, the shapes of these droplets change continuously due to evaporation, surface tension, and other properties of the fluid and substrate. As the droplet dries the contact line may move, which can have a significant affect on the final shape of the droplet. Therefore, the final pattern of the drops may change into a shape and size that is not desirable. For example, in LCD fabrication, if droplets for red filters and green filters are printed too far away from each other, a lower LCD resolution will result. However, if these droplets are placed too close, the drops may overlap when dried. Therefore, it is important to simulate the final pattern of a drop in order to proceed with confidence that the end product will be acceptable. Simulating the motion of a moving contact line in an evaporating droplet can present significant challenges.

In an embodiment of the present invention, the simulation of the final shape of the droplet can be repeated several times while adjusting the fluid properties of the droplet until a desired final shape is obtained. It should be noted that FIG. 1 simply illustrates one of many uses of the inkjet technology in industrial applications.

Although simulations in a rectangular domain provide some insights into achieving a desired final pattern, in a realistic setup, the droplet is often located in a more complex bank structure. One technique for addressing this challenge is disclosed in application Ser. No. 12/043,867, filed on Mar. 6, 2008 (AP341), which is incorporated by reference for all purposes.

Governing Equations

Figure 2:
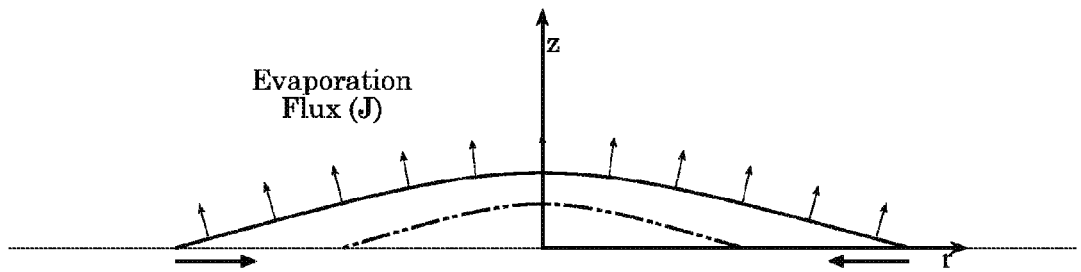
FIG. 2 is a simplified schematic diagram of a droplet disposed on a substrate in accordance with one embodiment of the invention.

Initially, a liquid drop on a flat substrate with a moving contact line is considered as shown in FIG. 2. The contact line may be represented by a plurality of points. Symmetry may be used to reduce the number of points that are used to represent the contact line. This is a reasonable assumption under many conditions. In a cylindrical coordinate system ($r^*, \theta^*, z^*$), the velocities $\vec{v}^* = (v_r^*, v_\theta^*, v_z^*)$ satisfy the Navier-Stokes equations described in equations (1)-(3). The superscript * refers to fully dimensioned variables as opposed to dimensionless variables.

$$\rho^* \left( \frac{\partial v_r^*}{\partial t^*} + v_r^* \frac{\partial v_r^*}{\partial r^*} + \frac{v_\theta^*}{r^*} \frac{\partial v_r^*}{\partial \theta^*} - \frac{v_\theta^{*2}}{r^*} + v_z^* \frac{\partial v_r^*}{\partial z^*} \right) = \quad (1)$$

$$-\frac{\partial p^*}{\partial r^*} + \left[ \frac{1}{r^*} \frac{\partial}{\partial r^*} (r^* \tau_{rr}^*) + \frac{1}{r^*} \frac{\partial \tau_{\theta r}^*}{\partial \theta^*} + \frac{\partial \tau_{zr}^*}{\partial z^*} - \frac{\tau_{\theta\theta}^*}{r^*} \right]$$

-continued $$\rho^*\left(\frac{\partial v_\theta^*}{\partial t^*} + v_r^* \frac{\partial v_\theta^*}{\partial r^*} + \frac{v_\theta^*}{r^*}\frac{\partial v_\theta^*}{\partial \theta^*} + \frac{v_r^* v_\theta^*}{r^*} + v_z^* \frac{\partial v_\theta^*}{\partial z^*}\right) = \qquad (2)$$
$$-\frac{1}{r^*}\frac{\partial p^*}{\partial \theta^*} + \left[\frac{1}{r^{*2}}\frac{\partial}{\partial r^*}(r^{*2}\tau_{r\theta}^*) + \frac{1}{r^*}\frac{\partial \tau_{\theta\theta}^*}{\partial \theta^*} + \frac{\partial \tau_{\theta z}^*}{\partial z^*} - \frac{\tau_{r\theta}^* - \tau_{\theta r}^*}{r^*}\right]$$

$$\rho^*\left(\frac{\partial v_z^*}{\partial t^*} + v_r^* \frac{\partial v_z^*}{\partial r^*} + \frac{v_\theta^*}{r^*}\frac{\partial v_z^*}{\partial \theta^*} + v_z^* \frac{\partial v_z^*}{\partial z^*}\right) = \qquad (3)$$
$$-\frac{\partial p^*}{\partial z^*} + \left[\frac{1}{r^*}\frac{\partial}{\partial r^*}(r^*\tau_{rz}^*) + \frac{1}{r^*}\frac{\partial \tau_{\theta z}^*}{\partial \theta^*} + \frac{\partial \tau_{zz}^*}{\partial z^*}\right]$$

The fluid density $\rho^*$, viscosity $\mu^*$, pressure $p^*$, and velocities $\vec{v}^*$ are dimensional variables. The components of stress tensor $\tau^*$ used in equations (1)-(3) are described in equations (4)-(9).

$$\tau_{rr}^* = \mu^*\left(2\frac{\partial v_r^*}{\partial r^*} - \frac{2}{3}\nabla\cdot v^*\right) \qquad (4)$$

$$\tau_{\theta\theta}^* = \mu^*\left[2\left(\frac{1}{r^*}\frac{\partial v_\theta^*}{\partial \theta^*} + \frac{v_r^*}{r^*}\right) - \frac{2}{3}\nabla\cdot v^*\right] \qquad (5)$$

$$\tau_{zz}^* = \mu^*\left(2\frac{\partial v_z^*}{\partial z^*} - \frac{2}{3}\nabla\cdot v^*\right) \qquad (6)$$

$$\tau_{r\theta}^* = \tau_{\theta r}^* = \mu^*\left[r^*\frac{\partial}{\partial r^*}\left(\frac{v_\theta^*}{r^*}\right) + \frac{1}{r^*}\frac{\partial v_r^*}{\partial \theta^*}\right] \qquad (7)$$

$$\tau_{\theta z}^* = \tau_{z\theta}^* = \mu^*\left(\frac{\partial v_\theta^*}{\partial z^*} + \frac{1}{r^*}\frac{\partial v_z^*}{\partial \theta^*}\right) \qquad (8)$$

$$\tau_{rz}^* = \tau_{zr}^* = \mu^*\left(\frac{\partial v_z^*}{\partial r^*} + \frac{\partial v_r^*}{\partial z^*}\right) \qquad (9)$$

In an embodiment of the present invention it is reasonable to assume that the fluid is incompressible, such that the constraint described by equation (10) applies.

$$\nabla \cdot v^* = 0 \qquad (10)$$

In an embodiment of the present invention it also reasonable to assume axial symmetry and that fluid flow in the droplet does not include a rotational component, such that the boundary conditions described by equations (11) apply.

$$\frac{\partial}{\partial \theta} = 0 \qquad (11)$$
$$v_\theta^* = 0$$

Equations (1) and (3) may be reduced by taking the assumptions in equations (10) and (11) into account yielding equations (12) and (13) as a result, which also include the substitutions of equations (4)-(9). Equation (2) reduces to zero when the assumptions in equation (10) and (11) are taken into account.

$$\rho^*\left(\frac{\partial v_r^*}{\partial t^*} + v_r^* \frac{\partial v_r^*}{\partial r^*} + v_z^* \frac{\partial v_r^*}{\partial z^*}\right) = -\frac{\partial p^*}{\partial r^*} + \qquad (12)$$
$$\mu^*\left[\frac{\partial}{\partial r^*}\left(\frac{1}{r^*}\frac{\partial (r^* v_r^*)}{\partial r^*}\right) + \frac{\partial^2 v_r^*}{\partial z^{*2}}\right] + 2\frac{\partial v_r^*}{\partial r^*}\frac{\partial \mu^*}{\partial r^*} + \left(\frac{\partial v_z^*}{\partial r^*} + \frac{\partial v_r^*}{\partial z^*}\right)\frac{\partial \mu^*}{\partial z^*}$$

$$\rho^*\left(\frac{\partial v_z^*}{\partial t^*} + v_r^* \frac{\partial v_z^*}{\partial r^*} + v_z^* \frac{\partial v_z^*}{\partial z^*}\right) = -\frac{\partial p^*}{\partial z^*} + \qquad (13)$$
$$\mu^*\left[\frac{1}{r^*}\frac{\partial}{\partial r^*}\left(r^*\frac{\partial v_z^*}{\partial r^*}\right) + \frac{\partial^2 v_z^*}{\partial z^{*2}}\right] + \left(\frac{\partial v_z^*}{\partial r^*} + \frac{\partial v_r^*}{\partial z^*}\right)\frac{\partial \mu^*}{\partial r^*} + 2\frac{\partial v_z^*}{\partial z^*}\frac{\partial \mu^*}{\partial z^*}$$

A along the interface between the droplet and the environment, which may be a vacuum, normal stresses and tangential stresses are balanced as described by equations (14) and (15). The pressure p in the droplet at the interface is balanced by the environmental pressure $p_A^*$, the surface energy which depends on the mean curvature of the droplet surface and the stress orthogonal to the interface as described by equation (14). In an embodiment of the present invention, which includes a simulation of a droplet evaporating in a vacuum, the tangential stress along the interface maybe zero as described by equation (15).

$$p^* = p_A^* - \frac{\sigma}{r^*}\frac{\partial}{\partial r^*}\left(\frac{r^*\frac{\partial h^*}{\partial r^*}}{\sqrt{1+\left(\frac{\partial h^*}{\partial r^*}\right)^2}}\right) + \qquad (14)$$
$$2\mu^*\frac{\left(\frac{\partial h^*}{\partial r^*}\right)^2\frac{\partial v_r^*}{\partial r^*} - \frac{\partial h^*}{\partial r^*}\left(\frac{\partial v_r^*}{\partial z^*} + \frac{\partial v_z^*}{\partial r^*}\right) + \frac{\partial v_z^*}{\partial z^*}}{1+\left(\frac{\partial h^*}{\partial r^*}\right)^2}$$

$$\frac{\partial h^*}{\partial r^*}\left(\frac{\partial v_r^*}{\partial r^*} - \frac{\partial v_z^*}{\partial z^*}\right) + \frac{1}{2}\left(\left(\frac{\partial h^*}{\partial r^*}\right)^2 - 1\right)\left(\frac{\partial v_r^*}{\partial z^*} + \frac{\partial v_z^*}{\partial r^*}\right) = 0 \qquad (15)$$

In an embodiment of the present invention it is reasonable to assume that that the ambient pressure $p_A^*$ is a constant. It is also reasonable to assume that ambient pressure $p_A^*$ is zero, if the droplet is in a vacuum. In the above equations h* is a function that describes the droplet profile as a function of time and space, e.g., in one embodiment is the height of the droplet above a first plane.

As mentioned above, the droplet is a solution composed of an incompressible fluid. The viscosity of the fluid may be a function of time and space. The viscosity of the fluid may be represented by equation (16) in which $\eta_{sp}$ is the specific viscosity of the fluid and $\mu_0^*$ is the initial fluid viscosity.

$$\mu^* = (1+\eta_{sp})\mu_0^* \qquad (16)$$

In an embodiment of the present invention an appropriate time scale and a length scale are chosen. In an embodiment of the present invention these scales may be chosen relative to the initial height of the droplet and an evaporation rate of the fluid. Other scales may be chosen without going beyond the scope and spirit of the present application. An individual skilled in the art will appreciate that these scales are chosen to ensure stability and accuracy of the simulation. Equations (17) describe how the velocity $\upsilon$, the pressure p, and the time t are scaled relative to a length $h_0^*$, a length $r_0^*$, a viscosity $\mu_0^*$ of the fluid, an initial evaporation rate per unit area $J_0^*$ and a density $\rho^*$ of the solvent. The Reynolds number Re, may also be written in terms of those scaling parameters $$U_c^* = J_0^* \quad v_r^* = U_c^* v_r \quad v_z^* = \frac{h_0^*}{r_0^*}U_c^* v_z \qquad (17)$$

-continued $$r^* = r_0^* r \quad z^* = h_0^* z \quad Re = \frac{\rho^* U_c^* h_0^*}{\mu_0^*}$$

$$p_c^* = \frac{\mu_0^* U_c^* r_0^*}{h_0^{*2}} \quad p^* = p_c^* p$$

$$t_c^* = \frac{r_0^*}{U_c^*} \quad t^* = t_c^* t$$

In an embodiment of the present invention the ratio $\epsilon = h_0^*/r_0^*$ may be assumed to be small, this is a reasonable assumption for a thin droplet. Equations (12) and (13) may be written in terms of dimensionless variables and the ratios as shown in equations (18) and (19).

$$\epsilon Re\left(\frac{\partial v_r}{\partial t} + v_r \frac{\partial v_r}{\partial r} + v_z \frac{\partial v_r}{\partial z}\right) = \tag{18}$$
$$\left\{(1+\eta_{sp})\left[\epsilon^2 \frac{\partial}{\partial r}\left(\frac{1}{r}\frac{\partial(rv_r)}{\partial z^2}\right) + \frac{\partial^2 v_r}{\partial z^2}\right] - \frac{\partial p}{\partial r}\right\} +$$
$$2\epsilon^2 \frac{\partial v_r}{\partial r}\frac{\partial \eta_{sp}}{\partial r} + \left(\epsilon^2 \frac{\partial v_z}{\partial r} + \frac{\partial v_r}{\partial z}\right)\frac{\partial \eta_{sp}}{\partial z}$$

$$\epsilon Re\left(\frac{\partial v_z}{\partial t} + v_r \frac{\partial v_z}{\partial r} + v_z \frac{\partial v_z}{\partial z}\right) = (1+\eta_{sp})\left[\epsilon^2 \frac{\partial}{\partial r}\left(\frac{1}{r}\frac{\partial(rv_z)}{\partial r}\right) + \frac{\partial^2 v_z}{\partial z^2}\right] - \tag{19}$$
$$\frac{1}{\epsilon^2}\frac{\partial p}{\partial z} + 2\frac{\partial v_z}{\partial z}\frac{\partial \eta_{sp}}{\partial z} + \left(\epsilon^2 \frac{\partial v_z}{\partial r} + \frac{\partial v_r}{\partial z}\right)\frac{\partial \eta_{sp}}{\partial r}$$

In an embodiment of the present invention it is assumed that the ratio $\epsilon$ is much less than one, in which case the relations set forth in equations (20) are also true.

$$\epsilon^2 \ll 1 \tag{20}$$
$$\epsilon Re \ll 1$$
$$\frac{\partial \eta_{sp}}{\partial z} = 0$$
$$\eta_{sp} \epsilon^2 \ll 1$$

Equations (20) may be used to sort the terms in equations (18) and (19) in order of the ratio $\epsilon$. Given the assumptions stated in equation (20), which are valid for a thin film, equation (18) may be modified by keeping only the leading order terms as shown in a simplified equation (21). Similarly, the leading order term of equation (19) may be kept and other terms dropped such that equation (22) may be used as a good approximation of equation (19).

$$-\frac{\partial p}{\partial r} + (1+\eta_{sp})\frac{\partial^2 v_r}{\partial z^2} = 0 \tag{21}$$

$$-\frac{\partial p}{\partial z} = 0 \tag{22}$$

The incompressible restraint condition on the fluid as described by equation (10) can be written in cylindrical coordinates as in equation (23) which also takes into account the non-rotational condition expressed by equations (11).

$$\frac{1}{r}\frac{\partial}{\partial r}(rv_r) + \frac{\partial v_z}{\partial z} = 0 \tag{23}$$

-continued $$-\frac{v_r}{r} + \frac{\partial v_r}{\partial r} + \frac{\partial v_z}{\partial z} = 0$$

In an embodiment of the present invention the ambient environment is a vacuum in which case $p_A^*$ is zero and $\epsilon^2 \eta_{sp} \ll 1$. Converting equation (14) to dimensionless variables and keeping only leading order terms gives us an approximation of the normal stress condition as described by equation (24).

$$p = -\frac{1}{Ca}\frac{1}{r}\frac{\partial}{\partial r}\left(r\frac{\partial h}{\partial r}\right) \tag{24}$$

The Capillary number (Cα) may be defined as $$Ca = \frac{J_0^* \mu^*}{\epsilon^4 \sigma^*}.$$

Equation (25) is a dimensionless form of the leading order term that may be used as a reasonable approximation of the tangential stress condition described in equation (15).

$$\frac{\partial v_r}{\partial z} = 0 \tag{25}$$

An embodiment of the present invention may be used to simulate a droplet in which the contact line location is moving over time. The substrate on which the droplet is located may be flat. In an embodiment of the present invention a no slip boundary condition may be imposed on the moving contact line. This boundary condition may lead to a non-integrable stress singularity at the contact line. In an embodiment of the present invention it may be useful to impose a model with a singular slip function as described in equation (26). Equation (26) describes a slip function constraint that may be imposed along the bottom of the droplet.

$$v_r - \frac{\lambda}{h}\frac{\partial v_r}{\partial z} = 0 \tag{26}$$

$$v_z = 0 \tag{27}$$

Equation (26) describes the slip condition in terms of a slip coefficient $\lambda$ which has been scaled in terms of the square of the initial height of the droplet $h_0^2$.

Solving equations (21), (22), and (23) for the radial velocity with boundary conditions (24), (25), (26), and, (27) gives us equation (28) which describes the radial velocity as a function of the solution parameters and the spatial coordinates.

$$v_r = -\frac{1}{Ca}\frac{1}{1+\eta_{sp}}\frac{\partial}{\partial r}\left[\frac{1}{r}\frac{\partial}{\partial r}\left(r\frac{\partial h}{\partial r}\right)\right]\left(\frac{z^2}{2} - hz - \lambda\right) \tag{28}$$

The kinematic boundary condition along the interface is described in equations (29) in both dimensioned and dimensionless form. The variable J* is the dimensioned evaporation rate which may be a function of both space and time. In an alternative embodiment of the present invention the evaporation rate is constant. The evaporation rate may also be defined in terms of other system variables such as the height h, radius r, or time t. The variable E=½ is a dimensionless scaling parameter. An individual skilled in the art will appreciate how to adapt equation (29) to represent how mechanisms other than evaporation may effect how the height of the profile varies over time. Examples of such mechanisms include condensation, chemical reactions, absorption, and other mechanisms that have an effect on the volume or type of material in the droplet.

$$\frac{\partial h^*}{\partial t^*} = -\frac{1}{r^*}\frac{\partial}{\partial r^*}(r^* h^* \langle v_r^* \rangle) - J^*(r^*, t^*) \quad (29)$$

$$\frac{\partial h}{\partial t} = -\frac{1}{r}\frac{\partial}{\partial r}(rh\langle v_r \rangle) - EJ(r, t)$$

The variable $\langle v_r^* \rangle$ used in equation (29) is described by equation (30) as the radial velocity averaged across the vertical axis. Equation (29) may be described as a height evolution equation that represents how the height of the droplet varies with time. Equation (29) may also be described as a lubrication type equation. A lubrication type equation is an equation in which approximations are made that are reasonable in the limit of thin droplets in which the height is small relative to the radius. One property of equation (29) is that is independent of the z-axis. In other words, the height evolution equation (29) is independent of the spatial coordinate in which height is measured. The height evolution equation is a dependent upon a spatial coordinate that is perpendicular to the spatial coordinate that it is dependent upon, e.g. the radius r in a cylindrical coordinate system.

$$\langle v_r^* \rangle = \frac{1}{h^*} \int_0^{h^*} v_r^* dz^* \quad (30)$$

$$\langle v_r \rangle = \frac{1}{h} \int_0^h v_r dz$$

Equation (28) may be substituted into equation (30) and integrated over the variable z to give a definition of $\langle v_r \rangle$ in terms of the solution parameters and the spatial coordinates as described in equation (31).

$$\frac{1}{h}\int_0^h v_r dz = \frac{1}{3Ca}\frac{1}{1+\eta_{sp}}\frac{\partial}{\partial r}\left[\frac{1}{r}\frac{\partial}{\partial r}\left(r\frac{\partial h}{\partial r}\right)\right](h^3 + 3\lambda h) \quad (31)$$

Equation (31) may be substituted into equation (29) providing a Lubrication type partial differential equation (32) that is representative of an approximation that describes how the height of the droplet evolves over time as function of the system parameters and the spatial variables. This is a high order differential equation. Like equation (29), equation (32) may be described as a height evolution equation.

$$\frac{\partial h}{\partial t} = \frac{1}{3Ca}\frac{1}{r}\frac{\partial}{\partial r}\left\{r\frac{h^3 + 3\lambda h}{1+\eta_{sp}}\frac{\partial}{\partial r}\left[\frac{1}{r}\frac{\partial}{\partial r}\left(r\frac{\partial h}{\partial r}\right)\right]\right\} - EJ(r, t) \quad (32)$$

Please note that the lubrication type equation (32) may be distinguished from lubrication type equations that only handle droplets with a fixed contact line. In particular includes a slip coefficient and can be used to describe an evaporating droplet with a moving contact line.

Note that when the height (h) of the droplet is small the linear slip term (3λh) dominates the cube of the droplet height term (h³) in equation (32). In an embodiment of the present invention equation the computational domain may be scaled such that the initial dimensionless domain has a range of [0, 1]. Over time the contact line moves and the solution domain may be limited subset of the computational domain. In an alternative embodiment of the present invention the droplet is growing and the solution domain increases and becomes greater than the initial computational domain.

Numerical Algorithm

In an embodiment of the present invention one or more non-linear equations including equation (32) are solved using a numerical method. Solving equation (32) using numerical methods can be difficult because equation (32) is stiff and includes fourth order differential terms. Finding a stable and accurate method for solving a stiff fourth order differential equation can be difficult and is dependent upon the form that the equation takes. An embodiment of the present invention may include a general numerical method for finding a solution to equation (32) on a regular finite difference grid that is representative of how a droplet evolves over time, when the effects of evaporation and a moving contact line are taken in to consideration.

Finite Difference Grid

Figure 3:
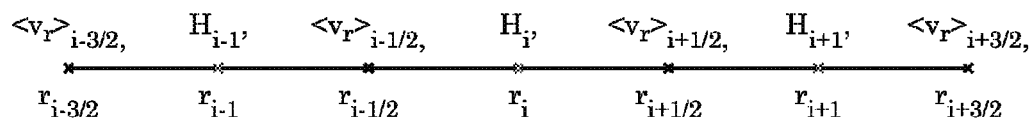
FIG. 3 is an illustration of a portion of a finite difference grid that may be employed in an embodiment of the present invention.

FIG. 3 is an illustration of a portion of a finite difference grid that may be employed in an embodiment of the present invention. The normalized range of the computational spatial domain described by the finite difference grid may be [0, 1]. In an embodiment of the present invention, a staggered grid may be employed. FIG. 3 is an illustration of a staggered grid in which the black crosses represent cell edges and the gray crosses represent cell centers. As shown in FIG. 3, the height h of the droplet and the radius r are calculated at the cell centers. The average velocities ($\langle v_r \rangle$) and the radius r are calculated at the cell edges. The applicants have found that evaluating these variables at these spatial positions improves the stability of the simulation. An alternative embodiment of the present invention may include evaluating these variables at alternative spatial positions without going beyond the scope and spirit of the present invention as defined in the claims. The finite difference grid shown in FIG. 3 is along the radial axis of a cylindrical coordinate system. An individual skilled in the art will appreciate how to extend the present invention into other coordinate systems, along multiple axes, and higher dimensions without going beyond the scope and spirit of the present invention as defined in the claims. Using standard notation each node in the spatial grid may be represented by a subscript with an index i. and each time step may be represented by a superscript with an index n.

An embodiment of the present invention may make use of a uniform grid. An alternative embodiment of the present invention may use a non-uniform grid.

Motion of the Contact Line

Figure 4:
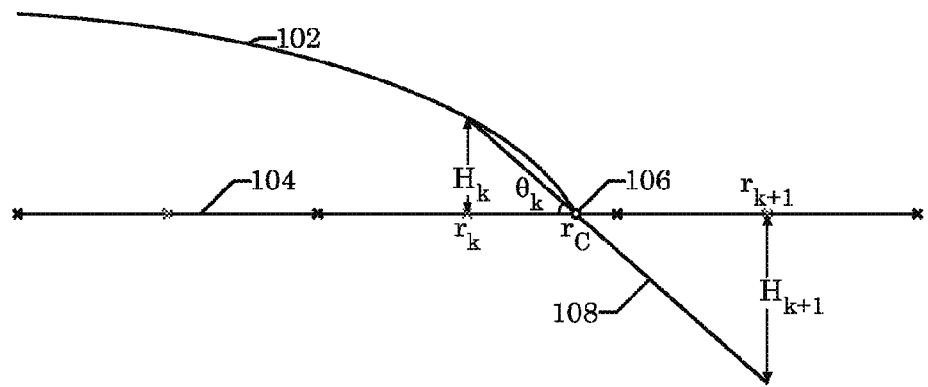
FIG. 4 is an illustration of a portion of a finite difference grid and a profile of a portion of the droplet being simulated as they might be employed in an embodiment of the present invention.

FIG. 4 is an additional illustration of the finite difference grid in which a portion of the droplet interface 102 is shown. The droplet interface 102 meets the substrate 104 at a contact line 106. The contact line 106 may also be identified as the radius $r_C$, or at a point C at a time step n, which is a function of time and will move as the contact line 106 moves.

FIG. 5 is an illustration of a method 500 of moving the contact line 106 in accordance with an embodiment of the present invention. A first step 502 may include identifying two nodes k and k+1 that are at a distance $r_k$ and $r_{k+1}$ from the origin, both of which are located at cell centers. Node k is the node closest to the contact line while remaining within the droplet, which is best described by equation (33).

$$[r_k < r_C \leq r_{k+1}]^n \tag{33}$$

A second step 504 may estimate an angle $\theta_k$ that using an equation (34).

$$\theta^* = \tan^{-1}\left(\frac{h_k^*}{r_C^* - r_k^*}\right) \tag{34}$$

In a step 506, a slip velocity $U_s^*$ may be calculated based on equation (35). The slip velocity may be calculated in the fully dimensioned coordinate system. An individual skilled in the art will appreciate how to calculate the slip velocity in the non-dimensional coordinate system.

$$[U_s^*]^n = \left[\frac{\omega^* \sigma_0^*}{3\mu^*}(\theta_k^{*m} - \theta_s^{*m})\right]^n \tag{35}$$

As used in equation (35), a scaling parameter $\omega$ is used to represent the effect on the slip velocity $U_s^*$, of a solid-liquid-gas interaction that occurs at the contact line between the environment, the droplet and the substrate. Equation (35) is also a function of a static contact angle $\theta_s$, which is dependent upon surface energy of the substrate relative to the droplet in the particular environment being simulated.

In an embodiment of the present invention, the exponent m=1 is used in equation (35), which means that the slip velocity $U_s^*$ is linearly related to the difference between the estimated contact angle $\theta^*$ at the contact line 106 and the static contact angle $\theta_s^*$. In an alternative embodiment of the present invention, the exponent m=3, which means that the slip velocity $U_s^*$ has a non-linear relationship to the difference between the estimated contact angle $\theta^*$ at the contact line 106 and the static contact angle 74 $_s^*$. An individual skilled in the art will appreciate how to adapt the present invention, to various values of the exponent m without going beyond the scope and spirit of the present invention as described in the claims. In one embodiment of the present invention the exponent m is a non-integer. Higher order approximations may be used without going beyond the scope and spirit of the present invention as defined in the claims.

In a step 508 the position of the contact line 106 at the next time step may be calculated based on the slip velocity. In one embodiment of the present invention the new position of the contact line 106 may be calculated using a simple difference approximation such as equation (36). Higher order difference equations may be used without going beyond the scope and spirit of the present invention as defined in the claims.

$$r_C^{*n+1} r_C^{*n} + U_s^* \Delta t^* \tag{36}$$

Time Discretization of the Height Evolution Equation

The matrix operator M as defined in equation (37) is used to simplify the presentation of the numerical method, and is representative of equation (32).

$$M^n = \begin{bmatrix} M_1^n \\ \vdots \\ M_i^n \\ \vdots \\ M_k^n \end{bmatrix} \tag{37}$$

The matrix operator M is a k×k matrix, wherein k is the number of nodes in the simulation. The matrices $M_i$, h, and J are k×1 matrices that correspond to the identified variables. The matrix operator $M_i$, may be thought of as a differential operator. Each partial derivative operator may be written as vector with an index i. The matrix $M^n$ may be defined in terms of sub-matrices $M_i^n$ as described in equation (37).

Each sub-matrix $M_i^n$ is a differential operator as described in equation (38). Equation (38) describes a matrix operator that includes calculating the height at a time step n and is applied to the height at time step n+1. The applicants have found that using the operator $M^n$ in this manner improves the stability of an embodiment of the present invention.

$$M_i^n h_i^{n+1} = -\frac{1}{3Ca}\frac{1}{r_i}\frac{\partial}{\partial r_i}\left[r\frac{h^{n^3} + 3\lambda h^n}{1+\eta_{sp}}\frac{\partial}{\partial r}\left(\frac{1}{r}\frac{\partial}{\partial r}\left(r\frac{\partial}{\partial r}\right)\right)\right]h_i^{n+1} \tag{38}$$

Each differential operator may be approximated with a finite difference operator such as the one described in equation (39). The half steps described in equation (39) coincide with the cell edges.

$$\frac{\partial}{\partial r_i}(\Box) = \frac{\Box_{i+\frac{1}{2}} - \Box_{i-\frac{1}{2}}}{\Delta r} \tag{39}$$

The differential operator and the finite difference operators from equation (39) may be applied to a second differential operator such as the one described in equation (40).

$$\Box = r\frac{h^{n^3} + 3\lambda h^n}{1+\eta_{sp}}\frac{\partial}{\partial r}\left(\frac{\partial^2}{\partial r^2} + \frac{1}{r}\frac{\partial}{\partial r}\right) \tag{40}$$

When the finite difference operator is applied to the second differential operator in equation (40) a part of it may take the form of equation (41). An individual skilled in the art would appreciate how the backward half step in equation (39) may be calculated using the same methodology.

$$\Box_{i+\frac{1}{2}} = r_{i+\frac{1}{2}}\frac{h_{i+\frac{1}{2}}^{n^3} + 3\lambda h_{i+\frac{1}{2}}^n}{1+\eta_{sp_{i+\frac{1}{2}}}}\frac{\partial}{\partial r_{i+\frac{1}{2}}}\left(\frac{\partial^2}{\partial r^2} + \frac{1}{r}\frac{\partial}{\partial r}\right) \tag{41}$$

Equation (41) includes an additional differential operator that may also be approximated by an additional finite difference operator as described by equation (42).

$$\frac{\partial}{\partial r_{i+\frac{1}{2}}}(\square) = \frac{(\square)_{i+1} - (\square)_i}{\Delta r} \tag{42}$$

The operator used in equation (42) may be the second order differential operator described in equation (43).

$$\square = \frac{\partial^2}{\partial r^2} + \frac{1}{r}\frac{\partial}{\partial r} \tag{43}$$

Equation (44) describes the result of applied the finite difference form of the operator from equation (43).

$$\square_i h_i^{n+1} = \frac{h_{i+1}^{n+1} - 2h_i^{n+1} + h_{i-1}^{n+1}}{(\Delta r)^2} + \frac{1}{r_i}\frac{h_{i+1}^{n+1} - h_{i-1}^{n+1}}{2\Delta r} \tag{44}$$

As described in equations (39), (42), and (44) each partial derivative may approximated with a finite difference approximation such as a second order Taylor expansion. The Taylor expansion may be a forward expansion, backward expansion or a central difference expansion. An individual skilled in the art will appreciate that other treatments of the derivatives may be used with out going beyond the spirit and scope of the present invention.

Equation (32) may be written in terms of equation (38) as in equation (45) and solved for $h_{n+1}$ such that that a new height may be found at a new time step. Equation (45) is a semi-implicit evolution equation that describes the evolution of the height of the droplet. Please note that the matrix M is multiplied by the matrix h at the time step n+1 instead of the time step n, the applicants have found that doing so improves stability. Please also note that the matrix M is evaluated at time step n.

$$\frac{h^{n+1} - h^n}{\Delta t} = M^n h^{n+1} - EJ^n \tag{45}$$

$$[I - \Delta t M^n] h^{n+1} = h^n - \Delta t E J^n$$

The evaporation rate J may be a constant or may be a function of time and space.

Boundary Conditions

The height of the droplet is only defined within the boundaries of the droplet. Calculating a differential near or on the boundary using a finite difference method can be difficult. One prior art solution to this problem includes predefining high order derivatives at the boundaries. Another prior art solution to this problem includes using an alternative differencing scheme, such as a backward differencing scheme. An additional prior art solution is to replace the abrupt change from the droplet region to the non-droplet region with a smooth analytical function such as those commonly used to approximate the Heavyside step function. An individual skilled in the art will appreciate that there are practically infinite number of ways to deal with this issue. It is often difficult to tell which of these many methods will provide accurate, stable results while using a minimum of resources. The applicants have found a unique method that solves this boundary condition problem and provides accurate, stable results while maintaining a low overhead for the particular problem discussed in this application.

FIG. 6 is an illustration of a differential evaluation method 600 that may be used in an embodiment of the present invention to evaluate the differentials. High order differentials may be evaluated using the differential evaluation method 600. A finite differencing scheme such as the ones defined in equations (38)-(44) may be used at node k and other nodes (k−1, etc.) that are near the contact line while still within the droplet.

The first step in the differential evaluation method 600 may be identifying node k in a step 502. The node (k) is defined in equation (33) as the node closest to contact line $r_C$ yet still inside the droplet at a time step n.

The second step 604 may include identifying the height at the node k at the time step n. This may be done based on initial data or on data from a previous time step n−1.

The third step 606 includes assigning a height h to one or more nodes (k+1, k+2, etc) outside the contact line $r_C$. In an embodiment of the present invention, the height assigned in the third step 606 is a negative value; while the heights calculated within the bounds of the droplet are positive. In an embodiment of the present invention, extrapolation is used to calculate the height that is assigned in the third step 606. In an embodiment of the present invention, the height of the droplet inside the contact line along with the position of the contact line is used to calculate the height assigned in the third step 606.

In an embodiment of the present invention, linear extrapolation is used to calculate the height at the node k+1 as described in equation (46). Equation (46) describes an extrapolation line 108, such as the one shown in FIG. 4. The extrapolation line 108, as shown in FIG. 4, passes through the contact line $r_C$ 106, the interface 102 at the node k, and reaches down to the height $h_{k+1}$ below the substrate.

$$[h_{k+1}]^n = \left[\frac{r_{k+1} - r_C}{r_k - r_C} h_k\right]^n \tag{46}$$

$$[h_{k+2}]^n = \left[\frac{r_{k+2} - r_C}{r_k - r_C} h_k\right]^n$$

A fourth step 608 is calculating a differential inside the droplet based on the height assigned to one or more nodes outside the droplet. In an embodiment of the present invention, the differential calculated is a high order differential. In an embodiment of the present invention, a finite difference method is used in step 608 to approximate the differential. In an embodiment of the present invention, a central difference method is used to approximate the differential. In an embodiment of the present invention, the high order differential used in step 608 is a series of nested differentials. In an embodiment of the present invention the series of nested differentials is the height evolution equation described in equation (32). In an embodiment of the present invention the finite difference method used to express equation (32) is a finite difference scheme that uses multiple nodes, in which some of the nodes in the finite difference scheme lie outside the droplet.

In an embodiment of the present invention, a non-linear extrapolation scheme is used to extrapolate a height value that is outside the droplet and below the substrate. If a non-linear extrapolation scheme is used than the height of the droplet at multiple nodes within the droplet may be used along with the contact line to extrapolate to a node outside the droplet. In an embodiment of the present invention the extrapolated line 108 may pass near but not through all the points used in the non-linear extrapolation method.

System

Figure 7:
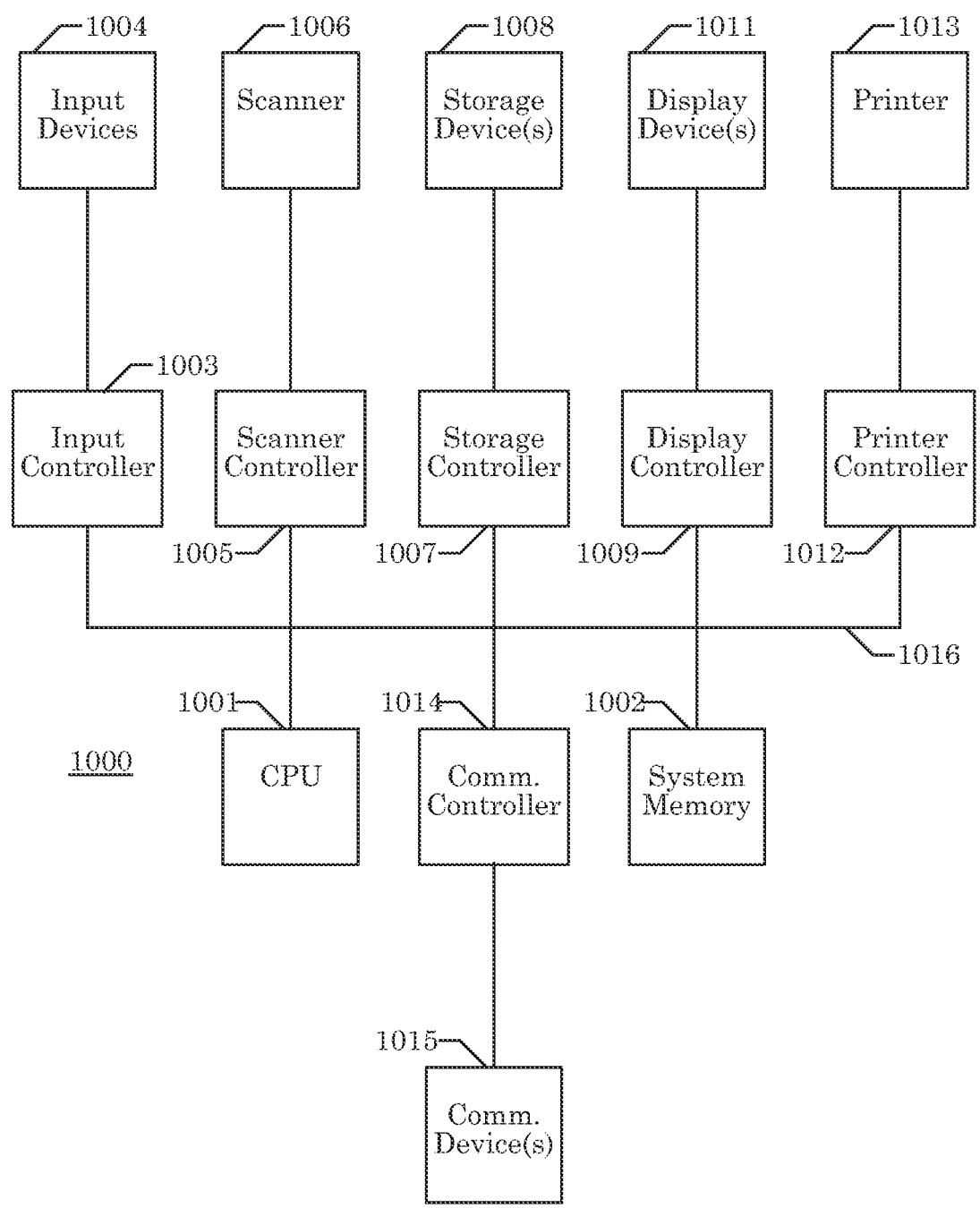
FIG. 7 is an illustration of a system that may be included in an embodiment of the present invention.

Having described the details of the invention, an exemplary system 1000, which may be used to implement one or more aspects of the present invention, will now be described with reference to FIG. 7. As illustrated in FIG. 7, the system includes a central processing unit (CPU) 1001 that provides computing resources and controls the computer. The CPU 1001 may be implemented with a microprocessor or the like, and may also include a graphics processor and/or a floating point coprocessor for mathematical computations. The system 1000 may also include system memory 1002, which may be in the form of random-access memory (RAM) and read-only memory (ROM).

A number of controllers and peripheral devices may also be provided, as shown in FIG. 7. An input controller 1003 represents an interface to various input device(s) 1004, such as a keyboard, mouse, or stylus. There may also be a scanner controller 1005, which communicates with a scanner 1006. The system 1000 may also include a storage controller 1007 for interfacing with one or more storage devices 1008 each of which includes a storage medium such as magnetic tape or disk, or an optical medium that might be used to record programs of instructions for operating systems, utilities and applications which may include embodiments of programs that implement various aspects of the present invention. Storage device(s) 1008 may also be used to store processed data or data to be processed in accordance with the invention. The system 1000 may also include a display controller 1009 for providing an interface to a display device 1011, which may be a cathode ray tube (CRT), or a thin film transistor (TFT) display. The system 1000 may also include a printer controller 1012 for communicating with a printer 1013. A communications controller 1014 may interface with one or more communication devices 1015 which enables the system 1000 to connect to remote devices through any of a variety of networks including the Internet, a local area network (LAN), a wide area network (WAN), or through any suitable electromagnetic carrier signals including infrared signals.

In the illustrated system, all major system components may connect to a bus 1016, which may represent more than one physical bus. However, various system components may or may not be in physical proximity to one another. For example, input data and/or output data may be remotely transmitted from one physical location to another. In addition, programs that implement various aspects of this invention may be accessed from a remote location (e.g., a server) over a network. Such data and/or programs may be conveyed through any of a variety of machine-readable medium including magnetic tape or disk or optical disc, or a transmitter, receiver pair.

The present invention may be conveniently implemented with software. However, alternative implementations are certainly possible, including a hardware implementation or a software/hardware implementation. Any hardware-implemented functions may be realized using ASIC(s), digital signal processing circuitry, or the like. Accordingly, the "means" terms in the claims are intended to cover both software and hardware implementations. Similarly, the term "computer-readable medium" as used herein includes software and or hardware having a program of instructions embodied thereon, or a combination thereof. With these implementation alternatives in mind, it is to be understood that the figures and accompanying description provide the functional information one skilled in the art would require to write program code (i.e., software) or to fabricate circuits (i.e., hardware) to perform the processing required.

In accordance with further aspects of the invention, any of the above-described methods or steps thereof may be embodied in a program of instructions (e.g., software), which may be stored on, or conveyed to, a computer or other processor-controlled device for execution on a computer-readable medium. Alternatively, any of the methods or steps thereof may be implemented using functionally equivalent hardware (e.g., application specific integrated circuit (ASIC), digital signal processing circuitry, etc.) or a combination of software and hardware.

While the invention has been described in conjunction with several specific embodiments, it is evident to those skilled in the art that many further alternatives, modifications, and variations will be apparent in light of the foregoing description. Thus, the invention described herein is intended to embrace all such alternatives, modifications, applications and variations as may fall within the spirit and scope of the appended claims.

What is claimed is:

1. A method for simulating a droplet of a fluid on a substrate, comprising:
providing a hardware data processing unit implementing the following steps: representing a height of the droplet above the substrate as a height function, said height function being a function of time and space, said height function determining a contact line of the droplet with the substrate;
using a height evolution equation to represent how the height function varies over time including the effect of said contact line moving;
evaluating the height function at a first point in space and a first point in time;
determining an extrapolated height value at the first point in time and a second point in space based on the height function at the first point in space and the first point in time, and based on the contact line at the first point in time, wherein the extrapolated height value at the second point in space is below the surface of the substrate; and
using the height evolution equation to calculate the height function at a second point in time based upon the extrapolated height value at the first point in time.

2. The method of claim 1, wherein:
the height function represents a first interface between the droplet and an environment, the height function represents a distance between the first interface and the substrate, said distance being along a dimension parallel to a first axis of a coordinate system;
the contact line represents an intersection of the first interface and the substrate;
the height evolution equation represents how the height of the droplet varies over time with a partial derivative of the height function with respect to time; and
the partial derivate of the height function with respect to time is equated to a first differential function dependent upon the height function and a slip coefficient, the slip coefficient represents a slipping interaction between the substrate, the droplet, and the environment, the slip coefficient is also representative of the effect that the slipping interaction has on motion of the fluid in the droplet; and the height evolution equation is independent of the spatial coordinate of the first axis.

3. The method of claim 2, further comprises:
   determining a contact angle at the first point in time between the first interface and the substrate at the contact line at the first point in time;
   determining a contact line velocity at the first point in time as a function of the difference between the contact angle at the first point in time raised to a power of a first exponent and a static contact angle raised to the power of the first exponent; and
   determining a position of the contact line at the second point in time based on the contact line velocity at the first point in time.

4. The method of claim 3, wherein the first exponent is 1.

5. The method of claim 3, wherein the first exponent is 3.

6. The method of claim 1, wherein a linear extrapolation method is used to determine the extrapolated height function at the second point in space and the first point in time, based upon a linear relationship between:
   the height function at the first point in time and space;
   the contact line at the first point in time; and
   the second point in space.

7. The method of claim 1, further comprises:
   determining a second extrapolated height value at the first point in time and a third point in space based on the height function at the first point in space and the first point in time, and the contact line at the first point in time, wherein the second extrapolated height value at the third point in space and is below the surface of the substrate; and
   said using of the height evolution equation to calculate the height function at the second point in time is based upon the extrapolated height value at the first point in time and the second point in space and the second extrapolated height value at the first point in time and the third point in space.

8. The method of claim 1, wherein:
   the height evolution equation represents a relationship between a temporal derivative of the height function and a sum of a first function and an evaporation function;
   the first function including a spatial derivative of a second function;
   the second function including a product of a third function and a spatial derivative of a fourth function;
   the third function being a sum of a cube of the height function and a fifth function; and
   the fifth function including a slip coefficient and the height function.

9. A system for simulating a droplet of a fluid on a substrate, comprising:
   a memory module; and
   a processor, wherein:
      the processor represents a height of the droplet above the substrate as a height function;
      the processor uses a height evolution equation to represent how the height function varies over time including the effect of a contact line that is moving;
      the processor evaluates the height function at a first point in space and a first point in time;
      the processor calculates an extrapolated height value at the first point in time and a second point in space based on the height function at the first point in space and the first point in time, and the contact line at the first point in time, wherein the extrapolated height value at the second point in space is below the surface of the substrate; and
      the processor uses the height evolution equation to calculate the height function at a second point in time based upon the extrapolated height value at the first point in time.

10. The system as recited in claim 9, wherein:
    the height function represented a first interface between the droplet and an environment, the height function represents a distance between the first interface and the substrate along a first spatial dimension, and the first spatial dimension is parallel to a first axis of a coordinate system;
    the contact line represents an intersection of the first interface and the substrate;
    the height evolution equation represents how the height of the droplet varies over time with a partial derivative of the height function with respect to time; and
    the partial derivate of the height function with respect to time is equated to a first differential function dependent upon the height function and a slip coefficient, the slip coefficient represents a slipping interaction between the substrate, the droplet, and the environment, the slip coefficient is also representative of the effect that the slipping interaction has on motion of the fluid in the droplet; and
    the height evolution equation is independent of the spatial coordinate of the first axis.

11. The system as recited in claim 10, wherein:
    the processor calculates a contact angle at the first point in time between the first interface and the substrate at the contact line at the first point in time;
    the processor calculates a contact line velocity at the first point in time as a function of the difference between the contact angle at the first point in time raised to a power of a first exponent and a static contact angle raised to the power of the first exponent; and
    the processor calculates a position of the contact line at the second point in time based on the contact line velocity at the first point in time.

12. The system as recited in claim 11, wherein the first exponent is 1.

13. The system as recited in claim 11, wherein the first exponent is 3.

14. The system as recited in claim 9, wherein linear extrapolation is used to calculate the extrapolated height function at the second point in space and the first point in time, based upon a linear relationship between:
    the height function at the first point in time and space;
    the contact line at the first point in time; and
    the second point in space.

15. The system as recited in claim 9, further comprises:
    the processor calculates a second extrapolated height value at the first point in time and a third point in space based on the height function at the first point in space and the first point in time, and the contact line at the first point in time, wherein the second extrapolated height value at the third point in space and is below the surface of the substrate; and
    the processor uses the height evolution equation to calculate the height function at the second point in time is based upon: the extrapolated height value at the first point in time and the second point in space; and the second extrapolated height value at the first point in time and the third point in space.

16. The system as recited in claim 9, wherein:
the height evolution equation represents a relationship between a temporal derivative of the height function and a sum of a first function and an evaporation function;
the first function includes a spatial derivative of a second function;
the second function includes a product of a third function and a spatial derivative of a fourth function;
the third function is a sum of a cube of the height function and a fifth function; and
the fifth function includes a slip coefficient and the height function.

* * * * *